(12) United States Patent
Hwang et al.

(10) Patent No.: US 9,064,862 B2
(45) Date of Patent: Jun. 23, 2015

(54) SEMICONDUCTOR CHIPS HAVING A DUAL-LAYERED STRUCTURE, PACKAGES HAVING THE SAME, AND METHODS OF FABRICATING THE SEMICONDUCTOR CHIPS AND THE PACKAGES

(75) Inventors: In Chul Hwang, Icheon-si (KR); Jae Myun Kim, Icheon-si (KR); Seung Jee Kim, Seongnam-si (KR); Jin Su Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/564,431

(22) Filed: Aug. 1, 2012

(65) Prior Publication Data

US 2013/0037942 A1 Feb. 14, 2013

(30) Foreign Application Priority Data

Aug. 8, 2011 (KR) .................. 10-2011-0078757

(51) Int. Cl.
*H01L 21/50* (2006.01)
*H01L 25/00* (2006.01)
*H01L 21/768* (2006.01)
*H01L 25/065* (2006.01)
*H01L 23/00* (2006.01)

(52) U.S. Cl.
CPC ....... *H01L 25/50* (2013.01); *H01L 2224/13025* (2013.01); *H01L 2224/16225* (2013.01); *H01L 2224/48227* (2013.01); *H01L 21/76898* (2013.01); *H01L 2924/10253* (2013.01); *H01L 24/13* (2013.01); *H01L 24/16* (2013.01); *H01L 24/80* (2013.01); *H01L 25/0657* (2013.01); H01L 2224/08145 (2013.01); H01L 2224/16146 (2013.01); H01L 2224/17181 (2013.01); H01L 2224/80006 (2013.01); H01L 2224/81191 (2013.01); H01L 2224/9202 (2013.01); H01L 2224/9222 (2013.01); H01L 2224/94 (2013.01); H01L 2225/06558 (2013.01); H01L 2225/06541 (2013.01); H01L 2225/06565 (2013.01); H01L 2224/80896 (2013.01); H01L 2924/12041 (2013.01); H01L 2224/0401 (2013.01)

(58) Field of Classification Search
CPC ............. H01L 23/3171; H01L 23/481; H01L 23/49816; H01L 23/5256; H01L 21/50
USPC ................................... 257/737, 777; 438/455
See application file for complete search history.

(56) References Cited

U.S. PATENT DOCUMENTS

| | | | | |
|---|---|---|---|---|
| 5,726,500 A * | 3/1998 | Duboz et al. | ................... | 257/777 |
| 6,355,980 B1 * | 3/2002 | Callahan | ........................ | 257/734 |
| 8,044,497 B2 * | 10/2011 | Cheah et al. | ................... | 257/686 |
| 2001/0019856 A1 * | 9/2001 | Takahashi et al. | ............. | 438/127 |
| 2003/0017647 A1 * | 1/2003 | Kwon et al. | ................... | 438/109 |
| 2009/0039527 A1 * | 2/2009 | Chan et al. | .................... | 257/777 |
| 2010/0140801 A1 * | 6/2010 | Anbai et al. | ................... | 257/738 |
| 2010/0194674 A1 * | 8/2010 | Nishihara et al. | ............. | 345/102 |

* cited by examiner

*Primary Examiner* — Mamadou Diallo
*Assistant Examiner* — Christina Sylvia
(74) *Attorney, Agent, or Firm* — William Park & Associates Ltd.

(57) ABSTRACT

Dual-layered structural semiconductor chips are provided. The semiconductor chip includes a first semiconductor chip and a second semiconductor chip bonded to the first semiconductor chip. The first semiconductor chip includes a first substrate having a first bottom surface. The second semiconductor chip includes a second substrate having a second bottom surface. The first bottom surface directly contacts the second bottom surface. The related packages and the related methods are also provided.

36 Claims, 12 Drawing Sheets

SEMICONDUCTOR CHIPS HAVING A DUAL-LAYERED STRUCTURE, PACKAGES HAVING THE SAME, AND METHODS OF FABRICATING THE SEMICONDUCTOR CHIPS AND THE PACKAGES

CROSS-REFERENCES TO RELATED APPLICATIONS

The present application claims priority to 35 U.S.C. 119(a) to Korean Application No. 10-2011-0078757, filed on Aug. 8, 2011, in the Korean intellectual property Office, which is incorporated herein by reference in its entirety set forth in full.

BACKGROUND

1. Field of the Invention

Embodiments of the present disclosure relate to semiconductor devices and methods of fabricating the same and, more particularly, to semiconductor chips having a dual-layered structure, packages having the same, and methods of fabricating the semiconductor chips and the packages.

2. Description of the Related Art

Recently, competitiveness of electronic systems including semiconductor chips may depend on the development of high performance, smaller and lighter of the electronic systems. As semiconductor chips become more highly integrated, size of the semiconductor chips has been gradually reduced whereas the number of input/output (I/O) pads of semiconductor chips may increase. Thus, there may be some limitations in realizing high performance semiconductor packages using known assembly processes. Further, there may be difficulties in developing smaller and lighter of the electronic systems. Accordingly, packaging techniques have developed to produce smaller, thinner and lighter semiconductor packages according to the trends of smaller and lighter electronic products.

A wafer level package process has been proposed to produce compact semiconductor packages. The wafer level package process may include forming a plurality of semiconductor chips on a wafer, encapsulating the plurality of semiconductor chips on the wafer, and sawing the wafer to separate the encapsulated semiconductor chips from each other.

Further, a multi chip package may be very attractive as a candidate for increasing a packing density since the multi chip package can be realized by vertically stacking a plurality of wafer level packages. However, according to the wafer level package process, the package size may be close to the semiconductor chip size. Thus, if the multi chip package includes a plurality of stacked wafer level packages, there may be some limitations and/or difficulties in realizing electrical connections between the stacked wafer level packages. Recently, through electrodes, for example, through silicon vias (TSVs) penetrating each of the stacked semiconductor chips has been proposed to solve the above limitations.

The through silicon vias may be formed by forming via holes penetrating a semiconductor chip and filling the via holes with metal. Moreover, bumps may be additionally formed on ends of the through silicon vias, and surfaces of the semiconductor chip other than the bumps may be covered with an insulation layer. The plurality of semiconductor chips having the through silicon vias may be vertically stacked to electrically connect the through silicon vias to each other. Thus, lengths of interconnections between the semiconductor chips may be remarkably reduced as compared with a multi chip package fabricated using a wire bonding technique.

However, even though the plurality of semiconductor chips are electrically connected to each other using the through silicon vias, there may be still some limitations in reducing the dimension of the semiconductor chips. For example, a thickness of the semiconductor chips may be reduced to increase the number of the semiconductor chips vertically staked. When the thickness of a semiconductor chip is reduced, however, the physical durability of the thinned semiconductor chips may be degraded, which may lead to defects such as cracks in the thinned semiconductor chips that may occur while the thinned semiconductor chips are stacked. Further, the wafer level packages may need additional processes for forming bumps and for insulating the individual semiconductor chips.

SUMMARY

Embodiments are directed to semiconductor chips having a dual-layered structure, semiconductor packages having the same, and methods of fabricating the semiconductor chips and the packages.

In an embodiment, a dual-layered structural semiconductor chip includes a semiconductor chip comprising a first semiconductor chip and a second semiconductor chip bonded to the first semiconductor chip. The first semiconductor chip includes a first substrate having a first bottom surface. The second semiconductor chip includes a second substrate having a second bottom surface. The first bottom surface directly contacts the second bottom surface.

In an embodiment, each of the first substrate and the second substrate may include a silicon substrate.

In an embodiment, the semiconductor chip may further include through electrodes penetrating the first and second semiconductor chips. The through electrodes may electrically connect the first semiconductor chip to the second semiconductor chip.

In this case, the semiconductor chip may further include first bumps disposed a first active layer disposed on a first top surface of the first semiconductor chip, where the first bumps cover first ends of the through electrodes and second bumps disposed on a second active layer disposed on a second top surface of the second semiconductor chip, where the second bumps cover second ends of the through electrodes.

The semiconductor chip may further include a redistribution layer disposed on at least one active layer of the first and second active layers and connected to the through electrodes, and bumps disposed on the redistribution layer.

The semiconductor chip may further include a redistribution layer disposed on at least one active layer of the first and second active layers and connected to the through electrodes, and pads disposed on the redistribution layer.

In an embodiment, each of the first and second semiconductor chips may be a wafer level chip.

In another embodiment, the method of fabricating a semiconductor chip includes providing a first semiconductor chip including a first substrate having a first top surface and a first bottom surface opposite to each other and a first active layer disposed on the first top surface, providing a second semiconductor chip including a second substrate having a second top surface and a second bottom surface opposite to each other and a second active layer disposed on the second top surface, bonding the first semiconductor chip to the second semiconductor chip so that the first bottom surface directly contacts the second bottom surface, and electrically connecting the first semiconductor chip to the second semiconductor chip.

In an embodiment, bonding the first semiconductor chip to the second semiconductor chip may includes activating the first bottom surface and the second bottom surface, and attaching the activated first bottom surface to the activated second bottom surface.

Activating the first bottom surface and the second bottom surface may include irradiating plasma onto the first bottom surface and the second bottom surface.

Activating the first bottom surface and the second bottom surface may include applying ion impact to the first bottom surface and the second bottom surface.

Activating the first bottom surface and the second bottom surface may include irradiating radicals onto the first bottom surface and the second bottom surface.

In an embodiment, bonding the first semiconductor chip to the second semiconductor chip may be performed at a room temperature.

In an embodiment, electrically connecting the first semiconductor chip to the second semiconductor chip may include forming through electrodes that penetrate the first and second semiconductor chips.

The through electrodes that penetrate the second semiconductor chips may be formed after the attaching process is performed.

The method may further include forming first bumps and second bumps on the first bottom surface and the second bottom surface respectively, after formation of the through electrodes. The first bumps may be formed to cover first ends of the through electrodes, and the second bumps may be formed to cover second ends of the through electrodes.

After formation of the through electrodes, the method may further include forming a redistribution layer on one active layer of the first and second active layers, and forming bumps on the other active layer of the first and second active layers. The redistribution layer may be connected to the through electrodes, and the bumps may be connected to the through electrodes.

The method may further include forming a redistribution layer on at least one active layer of the first and second active layers, and forming pads on the redistribution layer. The redistribution layer may be connected to the through electrodes.

In yet another embodiment, the semiconductor package includes a substrate and a dual-layered structural semiconductor chip on the substrate. The dual-layered structural semiconductor chip includes a first semiconductor chip including a first substrate having a first top surface and a first bottom surface opposite to each other and a first active layer disposed on the first top surface, and a second semiconductor chip including a second substrate having a second top surface and a second bottom surface opposite to each other and a second active layer disposed on the second top surface. The first bottom surface directly contacts the second bottom surface, and the first top surface faces the substrate.

In still another embodiment, the method of fabricating a semiconductor package includes providing a first semiconductor chip including a first substrate having a first top surface and a first bottom surface opposite to each other and a first active layer disposed on the first top surface, providing a second semiconductor chip including a second substrate having a second top surface and a second bottom surface opposite to each other and a second active layer disposed on the second top surface, bonding the first semiconductor chip to the second semiconductor chip so that the first bottom surface directly contacts the second bottom surface, electrically connecting the first semiconductor chip to the second semiconductor chip to form a dual-layered structural semiconductor chip, and mounting the dual-layered structural semiconductor chip on a substrate.

In yet still another embodiment, there is provided a system in package. The system in package includes a substrate, a first chip on the substrate, and a second chip having a dual-layered structure disposed on the first chip opposite to the substrate. The second chip includes a first semiconductor chip including a first substrate having a first top surface and a first bottom surface opposite to each other and a first active layer disposed on the first top surface, and a second semiconductor chip including a second substrate having a second top surface and a second bottom surface opposite to each other and a second active layer disposed on the second top surface. The first bottom surface directly contacts the second bottom surface.

In a further embodiment, the system in package includes a first chip, and a second chip having a dual-layered structure. The second chip includes a first semiconductor chip including a first substrate having a first bottom surface, and a second semiconductor chip including a second substrate having a second bottom surface. The first bottom surface directly contacts the second bottom surface, wherein the first chip and the second chip are disposed in a different region of a substrate, and where the first and second chips are configured to be electrically connected to the substrate.

In a yet further embodiment, there is provided an embedded package. The embedded package includes a dual-layered structural semiconductor chip. The dual-layered structural semiconductor chip further includes first semiconductor chip including a first substrate having a first bottom surface, and a second semiconductor chip including a second substrate having a second bottom surface. The first bottom surface directly contacts the second bottom surface, and where the first and second semiconductor chips each comprise bumps configured to be electrically connected to a redistribution layer.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Figure 1:
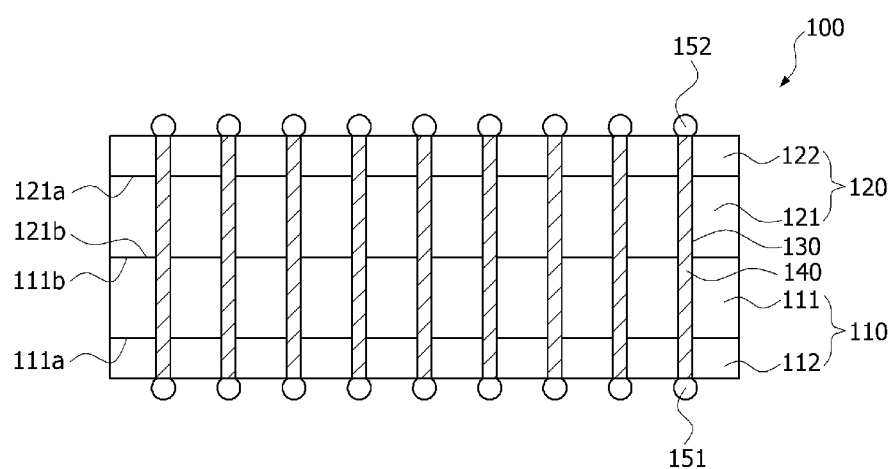
FIG. 1 is a cross sectional view illustrating a dual-layered structural semiconductor chip according to an embodiment.

Example embodiments will be described hereinafter in detail with reference to the accompanying drawings. Many different forms and embodiments are possible without deviating from the spirit and teachings of this disclosure and so this disclosure should not be construed as limited to the embodiments set forth herein. Rather, these embodiments are provided so that this disclosure will be thorough, and will convey the scope of the disclosure to those skilled in the art. In the drawings, the sizes and relative sizes of layers and regions may be exaggerated for clarity. Like reference numbers refer to like elements throughout.

As used herein the term "and/or" includes any and all combinations of one or more of the associated listed items.

FIG. 1 is a cross sectional view illustrating a dual-layered structural semiconductor chip according to an embodiment. Referring to FIG. 1, a dual-layered structural semiconductor chip 100 according to the present embodiment may be configured to include a first semiconductor chip 110 and a second semiconductor chip 120. The first and second semiconductor chips 110 and 120 may be attached to each other. In particular, the first and second semiconductor chips 110 and 120 may be in direct contact with each other. The first and second semiconductor chips 110 and 120 may be electrically connected to each other by through electrodes 140 disposed in via holes 130 that penetrate the first and second semiconductor chips 110 and 120. Each of the through electrodes 140 may penetrate the first and second semiconductor chips 110 and 120, as illustrated in FIG. 1. A first bump 151 and a second bump 152 may be disposed on both ends of each of the through electrodes 140, respectively. In an embodiment, each of the first and second semiconductor chips 110 and 120 may be a wafer level chip.

The first semiconductor chip 110 may include a first substrate 111 having a top surface 111a and a bottom surface 111b which are opposite to each other, and a first active layer 112 disposed on the top surface 111a of the first substrate 111 opposite to the bottom surface 111b. In an embodiment, the first substrate 111 may correspond to a silicon substrate. However, the first substrate 111 is not limited to the silicon substrate, that is, in other embodiments the first substrate 111 may be comprised of materials other than silicon. The first active layer 112 may be a layer in which semiconductor elements are formed. The first active layer 112 may be a separate layer from the first substrate 111. Alternatively, the first active layer 112 may include a surface region of the first substrate 111. The semiconductor elements may correspond to active elements and/or passive elements. The active elements may include transistors, and the passive elements may include capacitors, inductors and/or resistors.

The second semiconductor chip 120 may include a second substrate 121 having a top surface 121a and a bottom surface 121b which are opposite to each other, and a second active layer 122 disposed on the top surface 121a of the second substrate 121 opposite to the bottom surface 121b. In an embodiment, the second substrate 121 may correspond to a silicon substrate. However, the second substrate 121 is not limited to the silicon substrate, that is, in other embodiments the second substrate 121 may be comprised of materials other than silicon. The second active layer 122 may be a layer in which semiconductor elements are formed. The second active layer 122 may be a separate layer from the second substrate 121. Alternatively, the second active layer 122 may include a surface region of the second substrate 121. The semiconductor elements may correspond to active elements and/or passive elements. The active elements may include transistors, and the passive elements may include capacitors, inductors and/or resistors.

The bottom surface 111b of the first substrate 111 may be in direct contact with the bottom surface 121b of the second substrate 121. That is, no intervening layers may be present between the bottom surface 111b of the first substrate 111 and the bottom surface 121b of the second substrate 121. The bottom surfaces 111b and 121b of the first and second substrates 111 and 121 may contact each other using a surface activation bonding technique. The surface activation bonding technique will be described in detail hereinafter.

Figure 2:
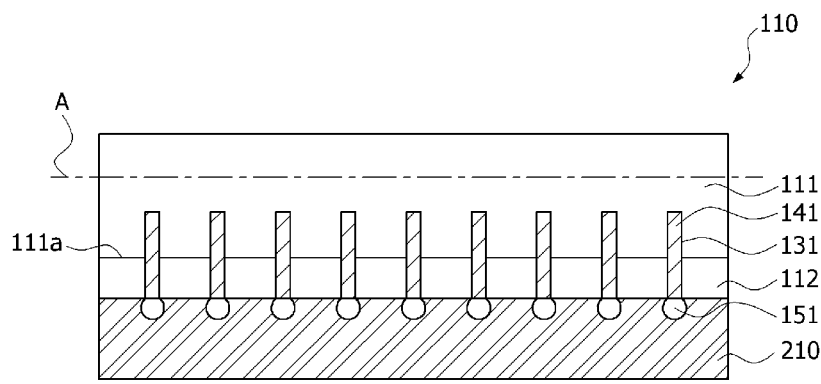
FIGS. 2, 3, 4, 5, 6 and 7 are cross sectional views illustrating a method of fabricating a dual-layered structural semiconductor chip according to an embodiment.

FIGS. 2 to 7 are cross sectional views illustrating a method of fabricating a dual-layered structural semiconductor chip according to an embodiment. As illustrated in FIG. 2, a first semiconductor chip 110 attached to a first carrier 210 may be provided. The first semiconductor chip 110 may be prepared by forming a semiconductor device on a wafer and forming first through electrodes 141 and first bumps 151. Specifically, a semiconductor device may be formed in a first active layer 112 disposed on a top surface (e.g., a front surface) 111a of a first substrate 111. In the present embodiment, the first substrate 111 may be a silicon wafer. The first active layer 112 and the first substrate 111 may be etched to a predetermined thickness, thereby forming first via holes 131 that penetrate the first active layer 112 and extend into the first substrate 111. First through electrodes 141 may be formed in respective ones of the first via holes 131. The first through electrodes 141 may be formed by filling the first via holes 131 with an electrode material. Although not shown in the drawings, after formation of the first via holes 131, an insulation layer may be formed on sidewalls of the first via holes 131 to electrically isolate the first through electrodes 141 from the first substrate 111 and the first active layer 112. First bumps 151 may be formed on the first through electrodes 141 which are exposed at a top surface of the first active layer 112. The first bumps 151 may be disposed on a side of the first active layer 112 that is opposite to a side of the first active layer 112 where the first substrate 111 is disposed. The top surface of the first active layer 112 may be then attached to the first carrier 210. A back side portion (e.g., a bottom side portion) of the first substrate 111 may be removed until a surface denoted by a dotted line A is exposed, using a grinding process. As a result, a thickness of the first substrate 111 may be reduced. The grinding process may be followed by a chemical mechanical polishing (CMP) process.

Figure 3:
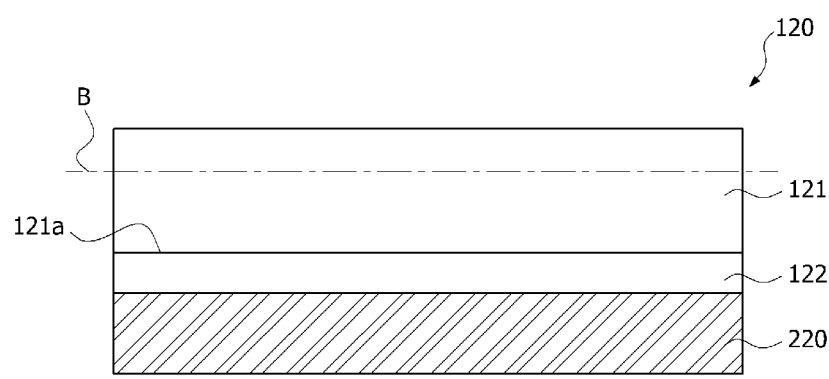

Subsequently, as illustrated in FIG. 3, a second semiconductor chip 120 attached to a second carrier 220 may be provided. The second semiconductor chip 120 may be prepared by forming a semiconductor device on a wafer. That is, the second semiconductor chip 120 may be prepared by forming a semiconductor device in a second active layer 122 disposed on a top surface (e.g., a front surface) 121a of a second substrate 121. In the present embodiment, the second substrate 121 may be a silicon wafer. A top surface of the second active layer 122 opposite to the second substrate 121 may be then attached to a second carrier 220. A back side portion (e.g., a bottom side portion) of the second substrate 121 may be then removed until a surface denoted by a dotted line B is exposed, using a grinding process. As a result, a thickness of the second substrate 121 may be reduced. The grinding process may be followed by a chemical mechanical polishing (CMP) process.

Figure 4:
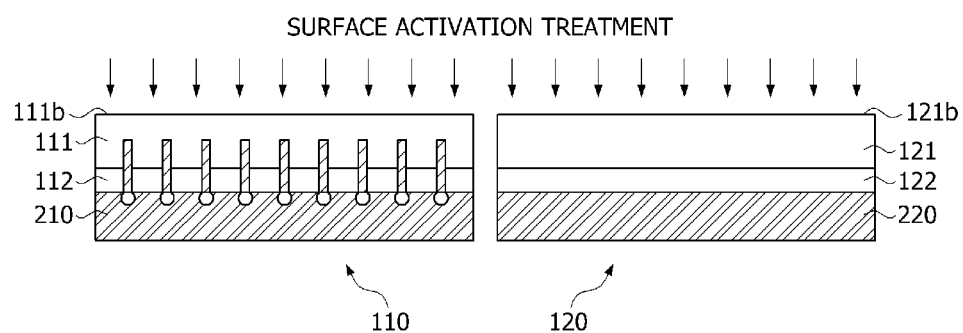

As illustrated in FIG. 4, a surface activation treatment may be applied to a bottom surface (e.g., a back surface) 111b of the first substrate 111 of the first semiconductor chip 110 and a bottom surface (e.g., a back surface) 121b of the second substrate 121 of the second semiconductor chip 120. In an embodiment, the surface activation treatment may be performed by irradiating plasma onto the bottom surface 111b of the first substrate 111 and the bottom surface 121b of the second substrate 121. In another embodiment, the surface activation treatment may be performed by applying ion impact of an inert gas such as an argon gas to the bottom surface 111b of the first substrate 111 and the bottom surface 121b of the second substrate 121, or by irradiating radicals onto the bottom surface 111b of the first substrate 111 and the bottom surface 121b of the second substrate 121. The surface activation treatment to the bottom surface 111b of the first substrate 111 and the surface activation treatment to the bottom surface 121b of the second substrate 121 may be simultaneously or sequentially performed in the same apparatus. While the surface activation treatments are performed, covalent bonds between silicon atoms near the bottom surfaces 111b and 121b may be broken to generate a plurality of dangling bonds. Theses dangling bonds may lead to ease of contact and bonding between the first and second substrates 111 and 121 even at a relatively low temperature.

Figure 5:
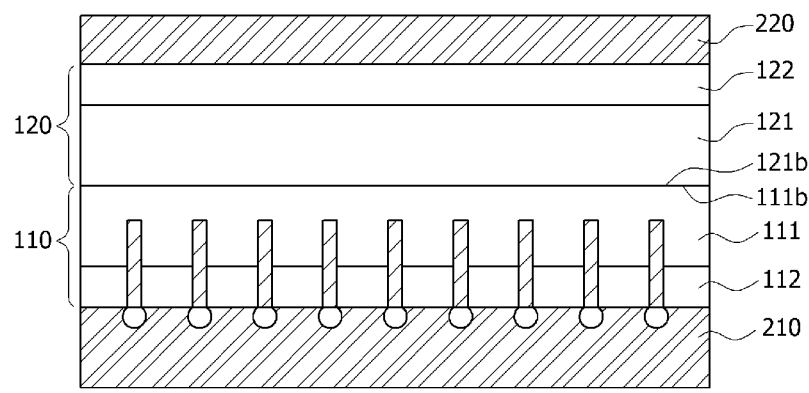

As illustrated in FIG. 5, after the surface activation treatments are performed, the bottom surfaces 111b and 121b of the first and second substrates 111 and 121 may be bonded to each other. That is, the bottom surfaces 111b and 121b of the first and second substrates 111 and 121 may directly contact each other without any intervening materials therebetween. Since the bottom surfaces 111b and 121b of the first and second substrates 111 and 121 are activated by the surface activation treatments, the bonding process of the first and second substrates 111 and 121 may be successfully performed even at a relatively low temperature and even with low pressure. In an embodiment, the bonding process of the first and second substrates 111 and 121 may be performed at a room temperature. After the first and second substrates 111 and 121 are bonded to each other, the second carrier 220 attached to the second chip 120 may be removed.

Figure 6:
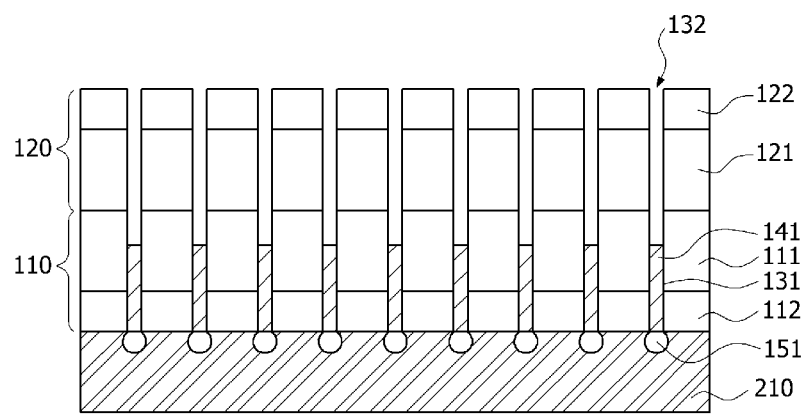

As illustrated in FIG. 6, second via holes 132 may be formed to penetrate the second active layer 122 and the second substrate 121. The second via holes 132 may be formed to extend into the first substrate 111. The second via holes 132 may be vertically aligned with respective ones of the first via holes 131. Thus, the second via holes 132 may be formed to expose the first through electrodes 141.

Figure 7:
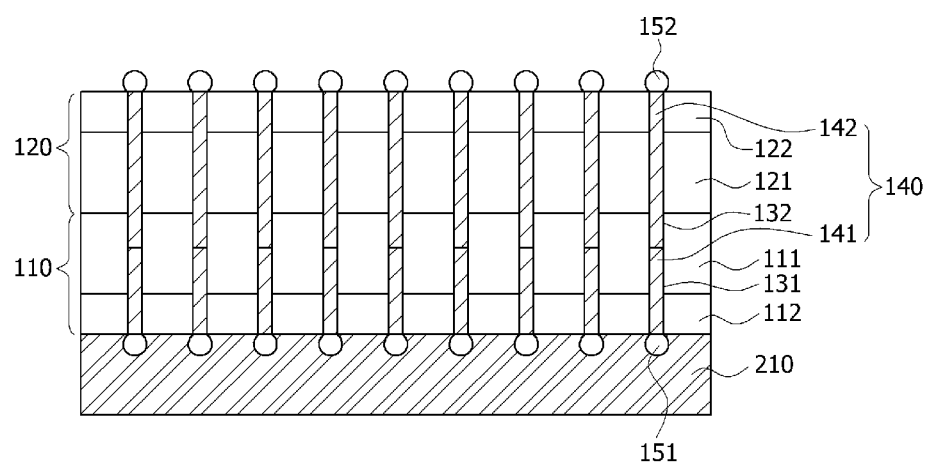

As illustrated in FIG. 7, the second via holes 132 may be filled with an electrode material to form second through electrodes 142. The second through electrodes 142 may be formed of the same material as the first through electrodes 141. The first through electrodes 141 and the second through electrodes 142 may be electrically connected to each other to constitute through electrodes 140, and the through electrodes 140 may electrically connect the first semiconductor chip 110 to the second semiconductor chip 120. That is, the through electrodes 140 may act as electrical signal paths between the first semiconductor chip 110 and the second semiconductor chip 120. After formation of the second through electrodes 142, second bumps 152 may be formed on the second through electrodes 142 to protrude from a surface of the second active layer 122 opposite to the second substrate 121. Subsequently, the first carrier 210 on the first semiconductor chip 110 may be removed to form a dual-layered structural semiconductor chip 100 including the first and second semiconductor chips 110 and 120 that directly contact each other without any intervening materials therebetween, as illustrated in FIG. 1.

Figure 8:
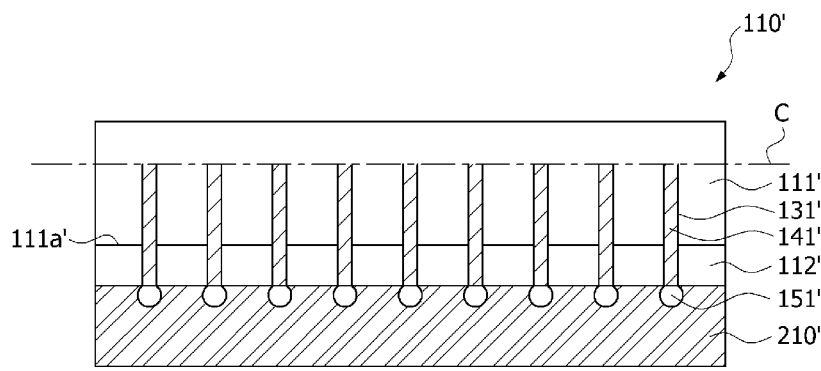
FIGS. 8, 9, 10, 11, 12, 13, 14 and 15 are cross sectional views illustrating a method of fabricating a dual-layered structural semiconductor chip according to another embodiment.

FIGS. 8 to 15 are cross sectional views illustrating a method of fabricating a dual-layered structural semiconductor chip according to another embodiment. As illustrated in FIG. 8, a first semiconductor chip 110' attached to a first carrier 210' may be provided. The first semiconductor chip 110' may be prepared by forming a semiconductor device on a wafer and forming first through electrodes 141' and first bumps 151'. Specifically, a semiconductor device may be formed in a first active layer 112' disposed on a top surface (e.g., a front surface) 111a' of a first substrate 111'. In the present embodiment, the first substrate 111' may be a silicon wafer. The first active layer 112' and the first substrate 111' may be etched to a predetermined thickness, thereby forming first via holes 131' that penetrate the first active layer 112' and extend into the first substrate 111'. The first via holes 131' may be filled with an electrode material to form first through electrodes 141'. Although not shown in the drawings, after formation of the first via holes 131', an insulation layer may be formed on sidewalls of the first via holes 131' to electrically isolate the first through electrodes 141' from the first substrate 111' and the first active layer 112'. First bumps 151' may be formed on the first through electrodes 141' which are exposed at a top surface of the first active layer 112' opposite to the first substrate 111'. The top surface of the first active layer 112' may be then attached to a first carrier 210'.

Figure 9:
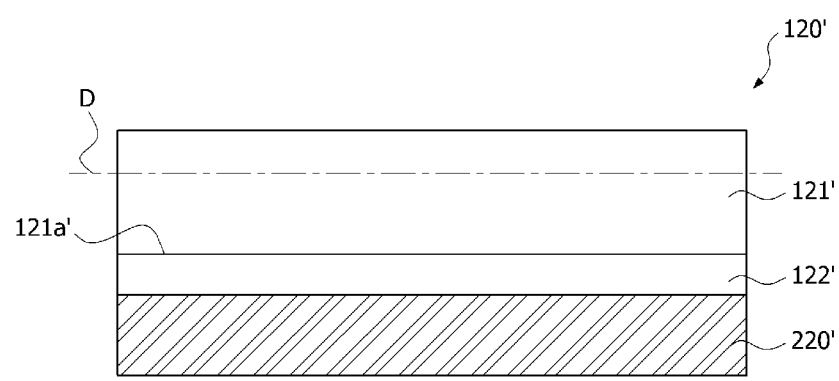

As illustrated in FIG. 9, a second semiconductor chip 120' attached to a second carrier 220' may be provided. The second semiconductor chip 120' may be prepared by forming a semiconductor device on a wafer. That is, the second semiconductor chip 120' may be prepared by forming a semiconductor device in a second active layer 122' disposed on a top surface (e.g., a front surface) 121a' of a second substrate 121'. In the present embodiment, the second substrate 121' may be a silicon wafer. A top surface of the second active layer 122' opposite to the second substrate 121' may be then attached to a second carrier 220'.

Figure 10:
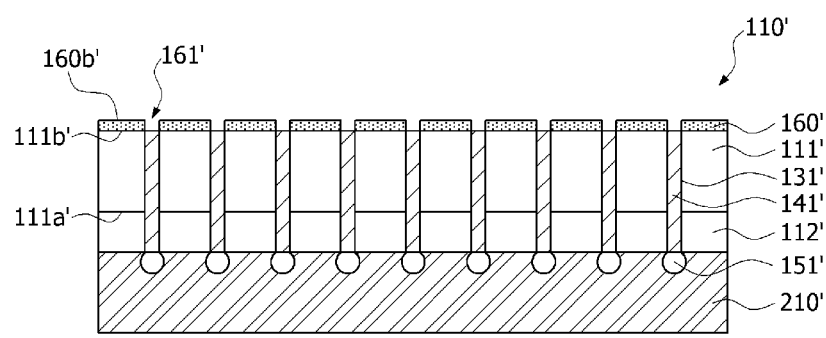

As illustrated in FIG. 10, a back side portion (e.g., a bottom side portion) of the first substrate 111' may be removed until a surface denoted by a dotted line (refer to C in FIG. 8) is exposed, using a grinding process. As a result, a thickness of the first substrate 111' may be reduced. The grinding process may be followed by a chemical mechanical polishing (CMP) process. In the present embodiment, it may be preferable that the grinding process for sufficiently reducing the thickness of the first semiconductor chip 110' is performed to expose ends of the first through electrodes 141'. An insulation pattern 160' with an insulation pattern surface 160b' may be then formed on a bottom surface 111b' of the first substrate 111'. The insulation pattern 160' may be formed to expose the first through electrodes 141'. Thus, the insulation pattern 160' may be formed to have openings 161' exposing respective ones of the first through electrodes 141'. The insulation pattern 160' may be formed of an insulation material having a property that endures without any damage during a subsequent surface activation treatment. In an embodiment, the insulation pattern 160' may be formed of an insulation material having an etch selectivity with respect to the second substrate 121'. For example, the insulation pattern 160' may be formed of a silicon oxide layer.

Figure 11:
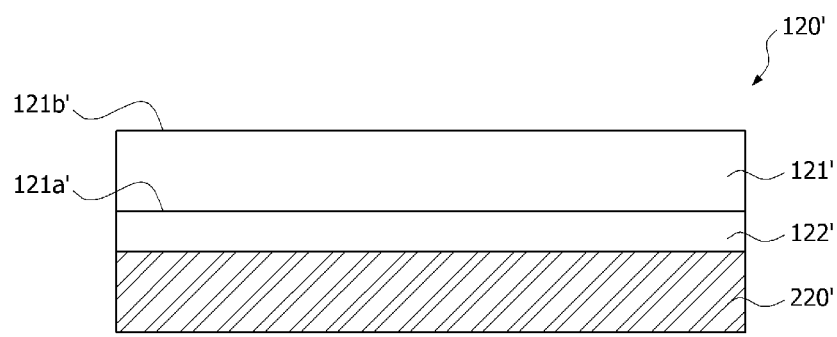

As illustrated in FIG. 11, a back side portion (e.g., a bottom side portion) of the second substrate 121' may be then removed until a surface denoted by a dotted line (refer to D in FIG. 9) is exposed, using a grinding process. As a result, a thickness of the second substrate 121' may be reduced. The grinding process may be followed by a chemical mechanical polishing (CMP) process.

Figure 12:
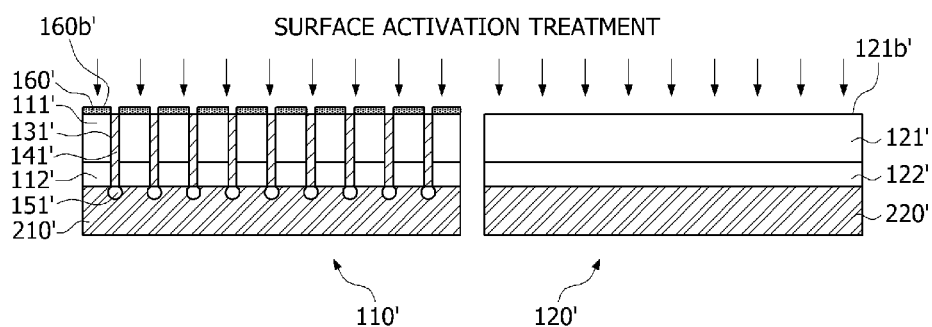

As illustrated in FIG. 12, a surface activation treatment may be applied to the insulation pattern surface 160b' of the first semiconductor chip 110' and a bottom surface (e.g., a back surface) 121b' of the second substrate 121' of the second semiconductor chip 120'. In an embodiment, the surface activation treatment may be performed by irradiating plasma onto the insulation pattern surface 160b' and the bottom surface 121b' of the second substrate 121'. In another embodiment, the surface activation treatment may be performed by applying ion impact of an inert gas such as an argon gas to the insulation pattern surface 160b' and the bottom surface 121b' of the second substrate 121' or by irradiating radicals onto the insulation pattern surface 160b' of the first substrate 111' and the bottom surface 121b' of the second substrate 121'. The surface activation treatment to the insulation pattern surface 160b' of the first substrate 111' and the surface activation treatment to the bottom surface 121b' of the second substrate 121' may be simultaneously or sequentially performed in the same apparatus. While the surface activation treatments are performed, covalent bonds between silicon atoms near the insulation pattern surface 160b' and the bottom surface 121b' may be broken to generate a plurality of dangling bonds. Theses dangling bonds may lead to ease of contact and bonding between the first and second substrates 111' and 121' even at a relatively low temperature.

Figure 13:
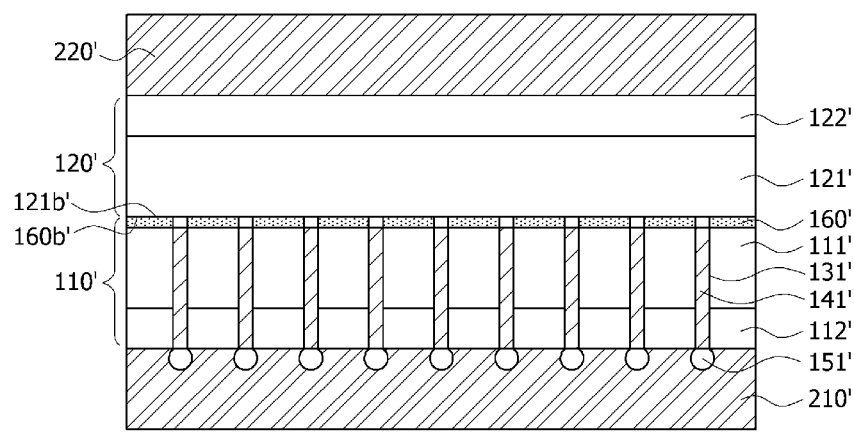

As illustrated in FIG. 13, after the surface activation treatments are performed, the insulation pattern surface 160b' of the first substrate 111' and the bottom surface 121b' of the second substrates 121' may be bonded to each other. That is, the insulation pattern surface 160b' of the first substrate 111' and the bottom surface 121b' of the second substrates 121' may contact each other with the insulation pattern 160' disposed therebetween. Since the insulation pattern surface 160b' of the first substrate 111' and the bottom surface 121b' of the second substrates 121' are activated by the surface activation treatments, the bonding process of the first and second substrates 111' and 121' may be successfully performed even at a relatively low temperature and even with low pressure. After the first and second substrates 111' and 121' are bonded to each other, the second carrier 220' attached to the second semiconductor chip 120' may be removed.

Figure 14:
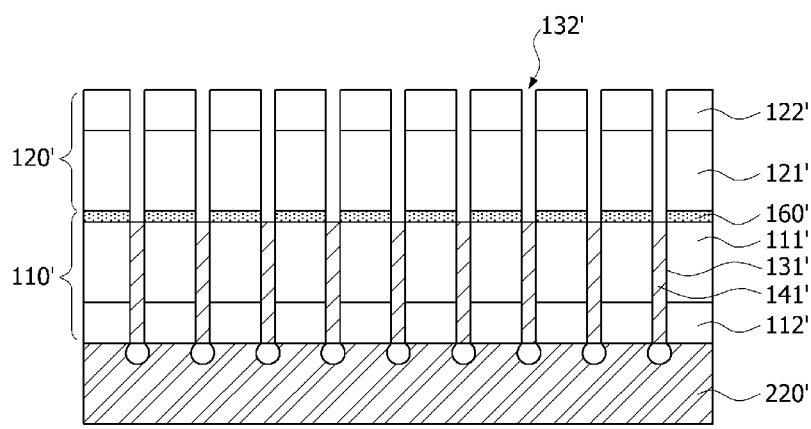

As illustrated in FIG. 14, second via holes 132' may be formed to penetrate the second active layer 122' and the second substrate 121'. The second via holes 132' may be vertically aligned with respective ones of the first via holes 131'. Thus, the second via holes 132' may be formed to expose the first through electrodes 141'. According to the present embodiment, even though the second via holes 132' are misaligned with respective ones of the first via holes 131' in an allowable range of a design rule, the second via holes 132' may not expose the first substrate 111' because of the presence of the insulation pattern 160'. That is, the insulation pattern 160' may prevent formation of unwanted signal paths even though the second via holes 132' are misaligned with respective ones of the first via holes 131'.

Figure 15:
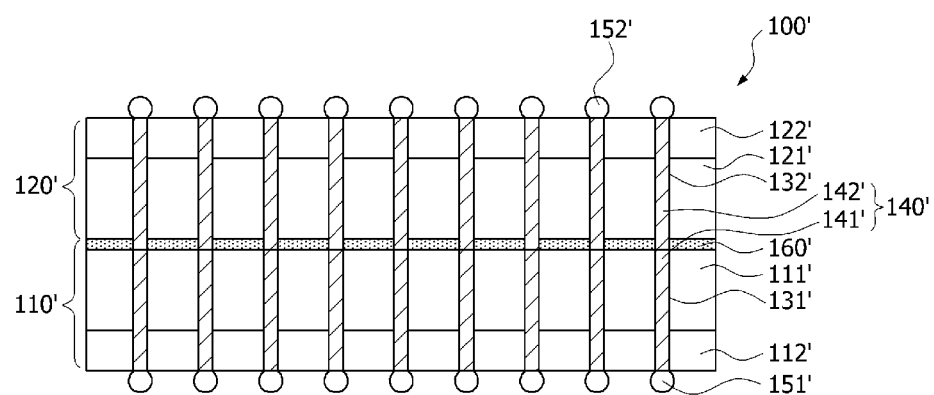

As illustrated in FIG. 15, the second via holes 132' may be filled with an electrode material to form second through electrodes 142'. The second through electrodes 142' may be formed of the same material as the first through electrodes 141'. The first through electrodes 141' and the second through electrodes 142' may be electrically connected to each other to constitute through electrodes 140', and the through electrodes 140' may electrically connect the first semiconductor chip 110' to the second semiconductor chip 120'. That is, the through electrodes 140' may act as electrical signal paths between the first semiconductor chip 110' and the second semiconductor chip 120'. After formation of the second through electrodes 142', second bumps 152' may be formed on the second through electrodes 142' to protrude from a surface of the second active layer 122' opposite to the second substrate 121'. Subsequently, the first carrier 210' on the first semiconductor chip 110' opposite to the second semiconductor chip 120' may be removed to form a dual-layered structural semiconductor chip 100'. According to the present embodiment, the insulation pattern 160' may be formed between the first and second semiconductor chips 111' and 121'. The insulation pattern 160' may be formed to merely prevent formation of unwanted signal paths even though the second via holes 132' are misaligned with the first via holes 131'. Thus, the insulation pattern 160' may be formed to be relatively thin.

Figure 16:
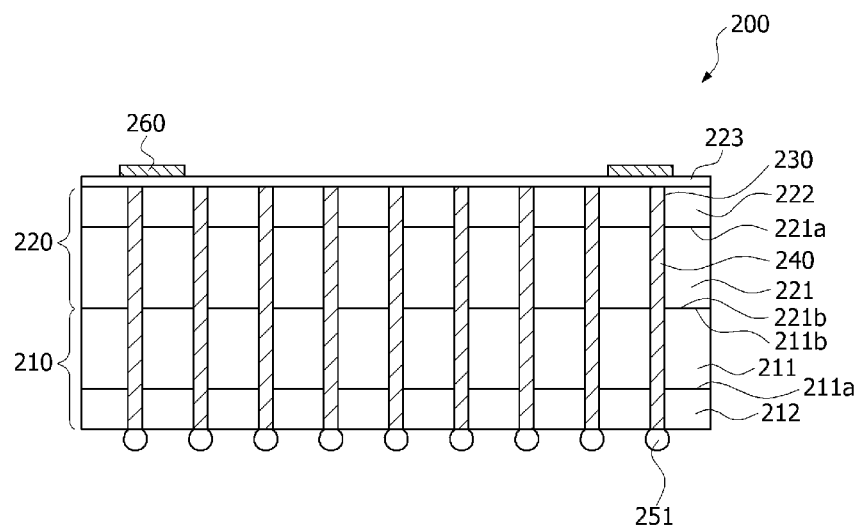
FIG. 16 is a cross sectional view illustrating a dual-layered structural semiconductor chip according to another embodiment.

FIG. 16 is a cross sectional view illustrating a dual-layered structural semiconductor chip according to another embodiment. Referring to FIG. 16, a dual-layered structural semiconductor chip 200 according to the present embodiment may be configured to include a first semiconductor chip 210 and a second semiconductor chip 220. The first and second semiconductor chips 210 and 220 may be attached to each other. In particular, the first and second semiconductor chips 210 and 220 may be in direct contact with each other. The first and second semiconductor chips 210 and 220 may be electrically connected to each other by through electrodes 240 disposed in via holes 230 that penetrate the first and second semiconductor chips 210 and 220. Each of the through electrodes 240 may penetrate the first and second semiconductor chips 210 and 220, as illustrated in FIG. 16. First bumps 251 may be disposed on the first semiconductor chip 210 opposite to the second semiconductor chip 220. The first bumps 251 may be disposed to cover first ends of the through electrodes 240. A redistribution layer 223 may be disposed on the second semiconductor chip 220 opposite to the first semiconductor chip 210, and bonding pads 260 may be disposed on the redistribution layer 223 opposite to the second semiconductor chip 220. Although not shown in FIG. 16, the redistribution layer 223 may include an insulation layer and redistributed interconnection lines that are disposed in the insulation layer to electrically connect the through electrodes 240 to the bonding pads 260. In an embodiment, the first and second semiconductor chips 210 and 220 may be wafer level chips.

Specifically, the first semiconductor chip 210 may include a first substrate 211 having a top surface 211a and a bottom surface 211b which are opposite to each other, and a first active layer 212 disposed on the top surface 211a of the first substrate 211. In an embodiment, the first substrate 211 may correspond to a silicon substrate. However, the first substrate 211 is not limited to the silicon substrate. The first active layer 212 may be a layer in which semiconductor elements are formed. The first active layer 212 may be a separate layer from the first substrate 211. Alternatively, the first active layer 212 may include a surface region of the first substrate 211. The semiconductor elements may correspond to active elements and/or passive elements. The active elements may include transistors, and the passive elements may include capacitors, inductors and/or resistors.

The second semiconductor chip 220 may include a second substrate 221 having a top surface 221a and a bottom surface 221b which are opposite to each other, and a second active layer 222 disposed on the top surface 221a of the second substrate 221. The redistribution layer 223 may be disposed on the second active layer 222. In an embodiment, the second substrate 221 may be a silicon substrate. However, the second substrate 221 is not limited to the silicon substrate. The second active layer 222 may be a layer in which semiconductor elements are formed. The second active layer 222 may be a separate layer from the second substrate 221. Alternatively, the second active layer 222 may include a surface region of the second substrate 221. The semiconductor elements may correspond to active elements and/or passive elements. The active elements may include transistors, and the passive elements may include capacitors, inductors and/or resistors. Although not shown in FIG. 16, the redistribution layer 223 may include an insulation layer and redistributed interconnection lines that are disposed in the insulation layer to electrically connect the through electrodes 240 to the bonding pads 260.

The bottom surface 211b of the first substrate 211 may directly contact the bottom surface 221b of the second substrate 221. That is, no intervening layers may be present between the bottom surface 211b of the first substrate 211 and the bottom surface 221b of the second substrate 221. The bottom surfaces 211b and 221b of the first and second substrates 211 and 221 may contact each other using the surface activation bonding technique, for example, the surface activation treatment described with reference to FIGS. 4 and 5.

Figure 17:
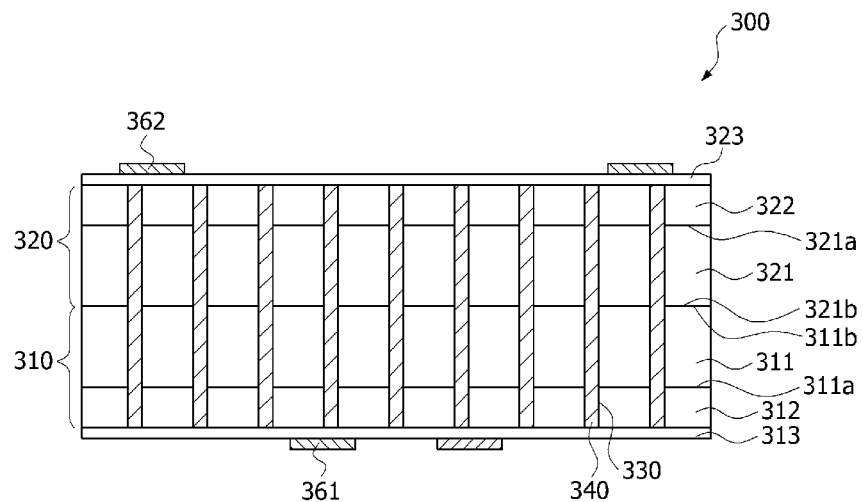
FIG. 17 is a cross sectional view illustrating a dual-layered structural semiconductor chip according to still another embodiment.

FIG. 17 is a cross sectional view illustrating a dual-layered structural semiconductor chip according to still another embodiment. Referring to FIG. 17, a dual-layered structural semiconductor chip 300 according to the present embodiment may include a first semiconductor chip 310 and a second semiconductor chip 320. The first and second semiconductor chips 310 and 320 may be attached to each other. In particular, the first and second semiconductor chips 310 and 320 may directly contact each other. The first and second semiconductor chips 310 and 320 may be electrically connected to each other by through electrodes 340 disposed in via holes 330 that penetrate the first and second semiconductor chips 310 and 320. Each of the through electrodes 340 may penetrate the first and second semiconductor chips 310 and 320, as illustrated in FIG. 17. A first redistribution layer 313 may be disposed on the first semiconductor chip 310 opposite to the second semiconductor chip 320, and first bonding pads 361 for wire bonding may be disposed on the first redistribution layer 313 opposite to the first semiconductor chip 310. Similarly, a second redistribution layer 323 may be disposed on the second semiconductor chip 320 opposite to the first semiconductor chip 310, and second bonding pads 362 for wire bonding may be disposed on the second redistribution layer 323 opposite to the second semiconductor chip 320. In an embodiment, the first and second semiconductor chips 310 and 320 may be wafer level chips.

Specifically, the first semiconductor chip 310 may include a first substrate 311 having a top surface 311a and a bottom surface 311b which are opposite to each other, and a first active layer 312 disposed on the top surface 311a of the first substrate 311. The first redistribution layer 313 may be disposed on the first active layer 312 opposite to the first substrate 311. In an embodiment, the first substrate 311 may be a silicon substrate. However, the first substrate 311 is not limited to the silicon substrate. The first active layer 312 may be a layer in which semiconductor elements are formed. The first active layer 312 may be a separate layer from the first substrate 311. Alternatively, the first active layer 312 may include a surface region of the first substrate 311. The semiconductor elements may correspond to active elements and/or passive elements. The active elements may include transistors, and the passive elements may include capacitors, inductors and/or resistors. Although not shown in FIG. 17, the first redistribution layer 313 may include an insulation layer and redistributed interconnection lines that are disposed in the insulation layer to electrically connect the through electrodes 340 to the first bonding pads 361.

The second semiconductor chip 320 may include a second substrate 321 having a top surface 321a and a bottom surface 321b which are opposite to each other, and a second active layer 322 disposed on the top surface 321a of the second substrate 321 opposite to the bottom surface 321b. The second redistribution layer 323 may be disposed on the second active layer 322 opposite to the second substrate 321. In an embodiment, the second substrate 321 may be a silicon substrate. However, the second substrate 321 is not limited to the silicon substrate. The second active layer 322 may be a layer in which semiconductor elements are formed. The second active layer 322 may be a separate layer from the second substrate 321. Alternatively, the second active layer 322 may include a surface region of the second substrate 321. The semiconductor elements may correspond to active elements and/or passive elements. The active elements may include transistors, and the passive elements may include capacitors, inductors and/or resistors. Although not shown in FIG. 17, the second redistribution layer 323 may include an insulation layer and redistributed interconnection lines that are disposed in the insulation layer to electrically connect the through electrodes 340 to the second bonding pads 362.

The bottom surface 311b of the first substrate 311 may directly contact the bottom surface 321b of the second substrate 321. That is, no intervening layers may be present between the bottom surface 311b of the first substrate 311 and the bottom surface 321b of the second substrate 321. The bottom surfaces 311b and 321b of the first and second substrates 311 and 321 may contact each other using the surface activation bonding technique, for example, the surface activation treatment described with reference to FIGS. 4 and 5.

Figure 18:
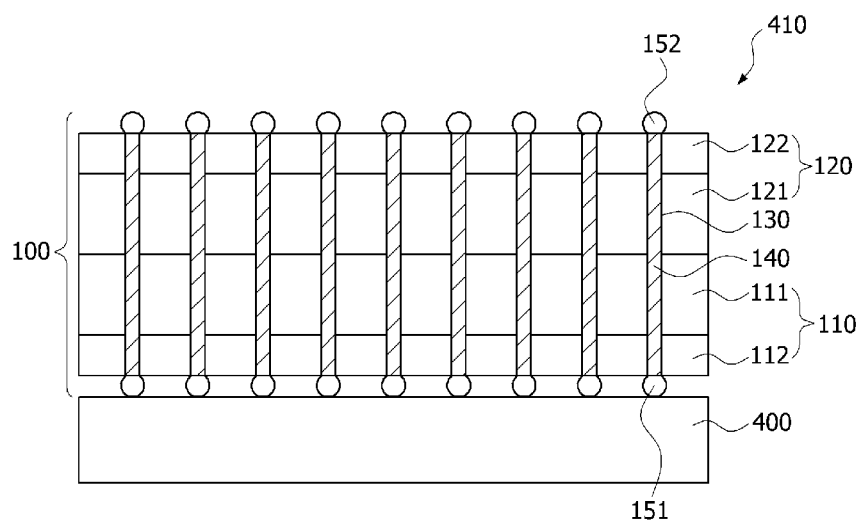
FIG. 18 is a cross sectional view illustrating a semiconductor package including a dual-layered structural semiconductor chip according to an embodiment.

FIG. 18 is a cross sectional view illustrating a package including a dual-layered structural semiconductor chip according to an embodiment. Referring to FIG. 18, a package 410 according to the present embodiment may be configured to have a structure such that a dual-layered structural semiconductor chip 100 is attached to a substrate 400. The dual-layered structural semiconductor chip 100 may have the same structure as described with reference to FIG. 1. That is, the dual-layered structural semiconductor chip 100 may include the first semiconductor chip 110 and the second semiconductor chip 120 which are directly bonded to each other. The first and second semiconductor chips 110 and 120 may be electrically connected to each other by the through electrodes 140 disposed in the via holes 130 that penetrate the first and second semiconductor chips 110 and 120. The first bumps 151 may be disposed on first ends of the through electrodes 140, and the second bumps 152 may be disposed on second ends of the through electrodes 140. In the drawings of FIGS. 1 and 10, like reference numbers refer to like components throughout. Thus, the explanations to the same components as described in the embodiment of FIG. 1 will be omitted or mentioned briefly.

In an embodiment, the substrate 400 may be a printed circuit board (PCB) including copper clad laminate. In another embodiment, the substrate 400 may be a package substrate having high reliability such as a high insulating property and a high heat resistant property, high elastic modulus for thin film, and a low coefficient of thermal expansion. In yet another embodiment, the substrate 400 may be a flexible printed circuit board (FPCB). The FPCB may be suitable for smaller and denser electronic products, for example, mobile phones, digital cameras and notebook computers. This is because the FPCB has durability against warpage. In still another embodiment, the substrate 400 may be a high performance thermal radiation board for realizing electronic products such as electronic systems employed in automobiles and light emitting diodes. In any case, internal interconnection lines (not shown) may be disposed in the substrate 400 to electrically connect the dual-layered structural semiconductor chip 100 to an external system.

Although the present embodiment is described in conjunction with the semiconductor chip 100 illustrated in FIG. 1 as an example, the semiconductor chip 100 may be replaced with the semiconductor chip 200 illustrated in FIG. 8 or the semiconductor chip 300 illustrated in FIG. 9.

Figure 19:
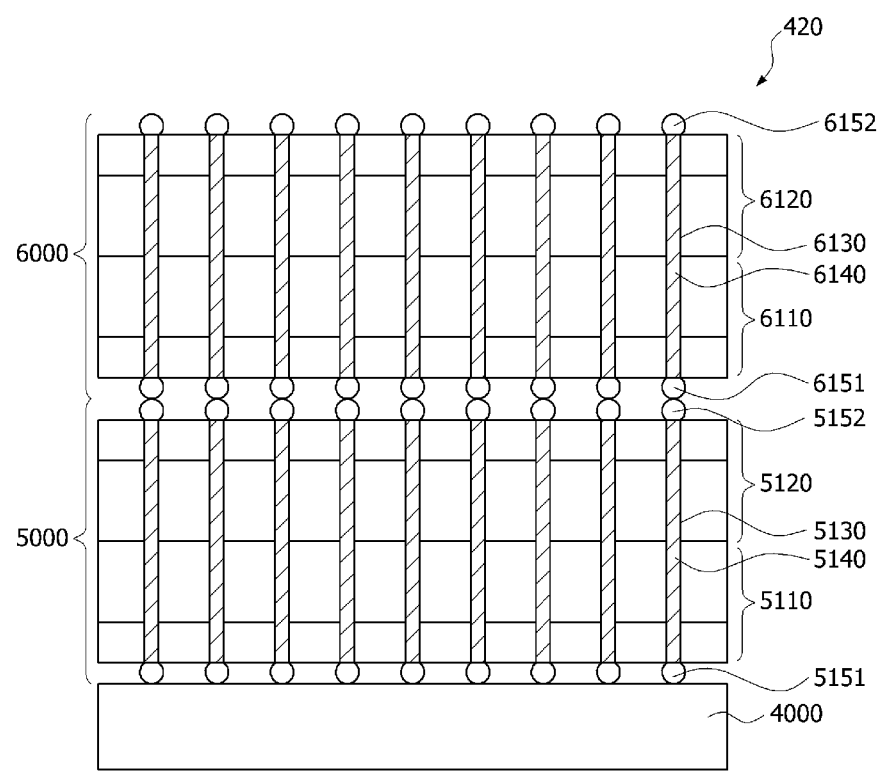
FIG. 19 is a cross sectional view illustrating a semiconductor package including a plurality of dual-layered structural semiconductor chips according to another embodiment.

FIG. 19 is a cross sectional view illustrating a semiconductor package including dual-layered structural semiconductor chips according to another embodiment. Referring to FIG. 19, a semiconductor package 420 according to the present embodiment may be configured to have a structure such that a first dual-layered structural semiconductor chip 5000 and a second dual-layered structural semiconductor chip 6000 are sequentially and vertically stacked on a substrate 4000. Although the present embodiment is described in conjunction with the first and second dual-layered structural semiconductor chips 5000 and 6000, three or more dual-layered structural semiconductor chips may be stacked on the substrate 4000. Each of the first and second dual-layered structural semiconductor chips 5000 and 6000 may have the same structure as the dual-layered structural semiconductor chip 100 illustrated in FIG. 1. Alternatively, each of the first and second dual-layered structural semiconductor chips 5000 and 6000 may be replaced with the semiconductor chip 200 illustrated in FIG. 16 or the semiconductor chip 300 illustrated in FIG. 17.

Specifically, the first dual-layered structural semiconductor chip 5000 may be configured to have a structure that a first semiconductor chip 5110 and a second semiconductor chip 5120 are bonded to each other to directly contact. The first and second semiconductor chips 5110 and 5120 may be electrically connected to each other by through electrodes 5140 disposed in via holes 5130 that penetrate the first and second semiconductor chips 5110 and 5120. First bumps 5151 may be disposed on first ends of the through electrodes 5140, and second bumps 5152 may be disposed on second ends of the through electrodes 5140. The first bumps 5151 disposed on a surface of the first semiconductor chip 5110 may be attached to the substrate 4000. The second dual-layered structural semiconductor chip 6000 may be configured to have a structure that a first semiconductor chip 6110 and a second semiconductor chip 6120 are bonded to each other to directly contact. The first and second semiconductor chips 6110 and 6120 may be electrically connected to each other by through electrodes 6140 disposed in via holes 6130 that penetrate the first and second semiconductor chips 6110 and 6120. First bumps 6151 may be disposed on first ends of the through electrodes 6140, and second bumps 6152 may be disposed on second ends of the through electrodes 6140. The first bumps 6151 of the second dual-layered structural semiconductor chip 6000 may be attached to the second bumps 5152 of the first dual-layered structural semiconductor chip 5000.

In an embodiment, the substrate 4000 may be a printed circuit board (PCB) including copper clad laminate. In another embodiment, the substrate 4000 may be a package substrate having high reliability such as a high insulating property and a high heat resistant property, high elastic modulus for thin film, and a low coefficient of thermal expansion. In yet another embodiment, the substrate 4000 may be a flexible printed circuit board (FPCB). The FPCB may be suitable for smaller and denser electronic products, for example, mobile phones, digital cameras and notebook computers. This is because the FPCB has durability against warpage. In still another embodiment, the substrate 4000 may be a high performance thermal radiation board for realizing electronic products such as electronic systems employed in automobiles and light emitting diodes. In any case, internal interconnection lines (not shown) may be disposed in the substrate 4000 to electrically connect the dual-layered structural semiconductor chips 5000 and 6000 to an external system.

Figure 20:
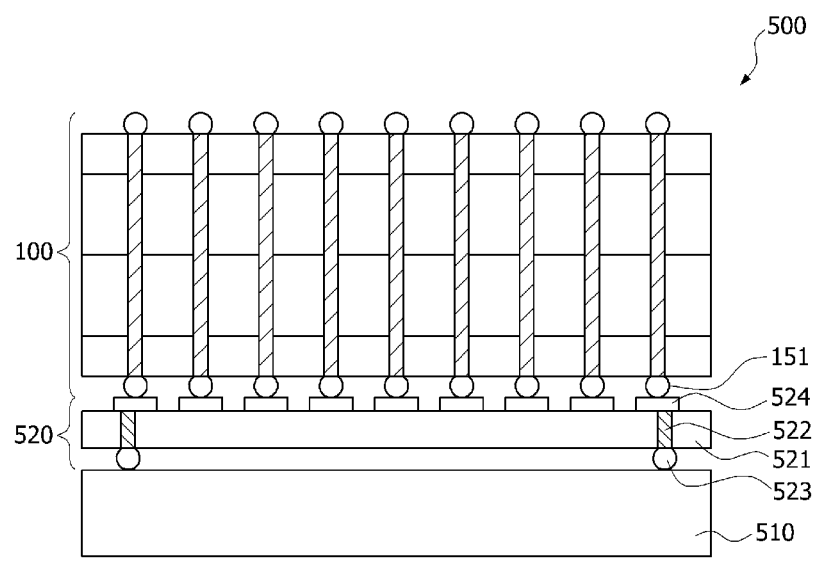
FIG. 20 is a cross sectional view illustrating an example of system in packages including dual-layered structural semiconductor chips according to an embodiment.

FIG. 20 is a cross sectional view illustrating an example of system in packages including dual-layered structural semiconductor chips according to an embodiment. Referring to FIG. 20, a system in package 500 according to the present embodiment may include a first chip 520 disposed on a substrate 510 and a second chip 100 on the first chip 520 opposite to the substrate 510. The second chip 100 may have a dual-layered structure. In an embodiment, the substrate 510 may be an embedded chip in which at least one chip including passive elements and/or active elements are mounted. In an embodiment, the first chip 520 may include a logic device such as a microprocessor, but not limited to the logic device. That is, the first chip 520 may include a different semiconductor device from the logic device. The first chip 520 may include a semiconductor die 521. The first chip 520 may further include through electrodes 522 penetrating the semiconductor die 521, bumps 523 formed on first ends of the through electrodes 522, and pads 524 formed on second ends of the through electrodes 522. The first chip 520 may be electrically connected to the substrate 510 through the bumps 523 and may be electrically connected to the second chip 100 through the pads 524. The second chip 100 may include a semiconductor memory device, but not limited to the semiconductor memory device. The second chip 100 may correspond to the dual-layered structural semiconductor chip 100 described with reference to FIG. 1. Thus, detailed descriptions to the second chip 100 will be omitted. The first and second chips 520 and 100 may be electrically connected to each other through the pads 524 of the first chip 520 and the first bumps 151 of the second chip 100.

Figure 21:
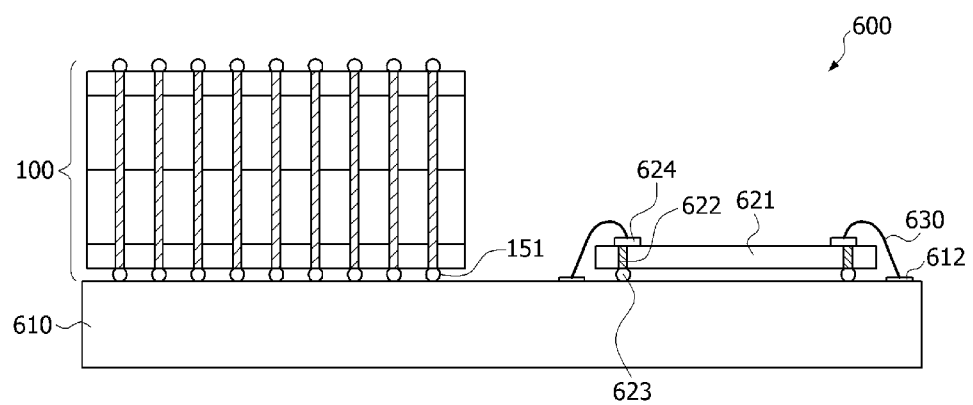
FIG. 21 is a cross sectional view illustrating another example of system in packages including dual-layered structural semiconductor chips according to an embodiment.

FIG. 21 is a cross sectional view illustrating another example of system in packages including dual-layered structural semiconductor chips according to an embodiment. Referring to FIG. 21, a system in package 600 according to the present embodiment may include a first chip 621 disposed on a first region of a substrate 610 and a second chip 100 disposed on a second region of the substrate 610. The first chip 621 may be electrically connected to the substrate 610 by bumps 623 and pads 624 formed at both ends of through electrodes 622 that penetrate the first chip 621. The pads 624 may be electrically connected to the substrate 610 through wires 630. The second chip 100 may be electrically connected to the substrate 610 through the first bumps 151 of the second chip 100 and pads (not shown) of the substrate 610. According to the system in package 600, the second chip 100 may not be stacked on the first chip 621, unlike the embodiment illustrated in FIG. 20. Thus, a plurality of second chips 100 having the same structure may be vertically stacked on the substrate 610 without any influences on the first chip 621.

Figure 22:
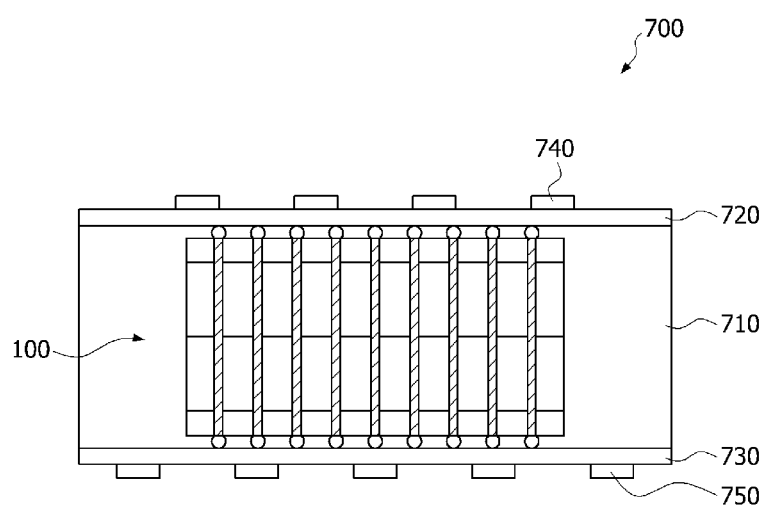
FIG. 22 is a cross sectional view illustrating an example of embedded packages including dual-layered structural semiconductor chips according to an embodiment.

FIG. 22 is a cross sectional view illustrating an example of embedded packages including dual-layered structural semiconductor chips according to an embodiment. Referring to FIG. 22, an embedded package 700 according to the present embodiment may be configured to have a structure that a dual-layered structural semiconductor chip 100 is mounted in a substrate 710. The dual-layered structural semiconductor chip 100 may have the same structure as described with reference to FIG. 1. Thus, the descriptions to the dual-layered structural semiconductor chip 100 will be omitted in the present embodiment. A first redistribution layer 720 may be disposed on a top surface of the substrate 710, and a second redistribution layer 730 may be disposed on a bottom surface of the substrate 710. The first redistribution layer 720 may be connected to first bumps disposed on a top surface of the semiconductor chip 100, and the second redistribution layer 730 may be connected to second bumps disposed on a bottom surface of the semiconductor chip 100. The first redistribution layer 720 may include an insulation layer and redistributed interconnection lines disposed in the insulation layer. Similarly, the second redistribution layer 730 may include an insulation layer and redistributed interconnection lines disposed in the insulation layer. The redistributed interconnection lines in the first redistribution layer 720 may electrically connect the first bumps of the semiconductor chip 100 to pads 740 disposed on the first redistribution layer 720. Similarly, the redistributed interconnection lines in the second redistribution layer 730 may electrically connect the second bumps of the semiconductor chip 100 to pads 750 disposed on the second redistribution layer 730. In an embodiment, at least one additional semiconductor chip may be mounted on the substrate 710. The additional semiconductor chip may include one of the dual-layered structural semiconductor chips according to the embodiments.

According to the embodiments set forth above, a pair of semiconductor chips are directly bonded to each other, thereby forming a dual-layered structural semiconductor chip. Thus, the dual-layered structural semiconductor chip may have the same packing density as the conventional semiconductor chip including a pair of single-layered structural semiconductor chips vertically stacked, when viewed from a plan view. However, the dual-layered structural semiconductor chip can be directly bonded to each other without any intervening material layers therebetween while the conventional semiconductor chip requires interconnection lines disposed between the pair of single-layered structural semiconductor chips. Thus, a thickness of the dual-layered structural semiconductor chip can be reduced as compared with the conventional semiconductor chip.

Embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A dual-layered structural semiconductor chip, the semiconductor chip comprising:
a first semiconductor chip including a first silicon substrate having a first bottom silicon surface; and
a second semiconductor chip including a second silicon substrate having a second bottom silicon surface,
wherein the first bottom silicon surface of the first silicon substrate directly contacts the second bottom silicon surface of the second silicon substrate.

2. The semiconductor chip of claim 1, further comprising through electrodes penetrating the first and second semiconductor chips,
wherein the through electrodes electrically connect the first semiconductor chip to the second semiconductor chip.

3. The semiconductor chip of claim 2, further comprising:
first bumps disposed on a first active layer disposed on a first top surface of the first semiconductor chip, where the first bumps cover first ends of the through electrodes; and
second bumps disposed on a second active layer disposed on a second top surface of the second semiconductor chip, where the second bumps cover second ends of the through electrodes.

4. The semiconductor chip of claim 3, further comprising:
a redistribution layer disposed on one active layer of the first and second active layers and connected to the through electrodes; and
bumps disposed on the other active layer of the first and second active layers and connected to the through electrodes.

5. The semiconductor chip of claim 3, further comprising:
a redistribution layer disposed on at least one active layer of the first and second active layers and connected to the through electrodes; and
pads on the redistribution layer.

6. The semiconductor chip of claim 1, wherein each of the first and second semiconductor chips is a wafer level chip.

7. A method of fabricating a dual-layered structural semiconductor chip, the method comprising:
providing a first semiconductor chip including a first silicon substrate having a first top surface and a first bottom silicon surface opposite to each other and a first active layer disposed on the first top surface;
providing a second semiconductor chip including a second silicon substrate having a second top surface and a second silicon bottom surface opposite to each other and a second active layer disposed on the second top surface;
bonding the first semiconductor chip to the second semiconductor chip so that the first bottom silicon surface of the first silicon substrate directly contacts the second bottom silicon surface of the second silicon substrate; and
electrically connecting the first semiconductor chip to the second semiconductor chip.

8. The method of claim 7, wherein bonding the first semiconductor chip to the second semiconductor chip includes:
activating the first bottom surface and the second bottom surface; and
attaching the activated first bottom surface to the activated second bottom surface.

9. The method of claim 8, wherein activating the first bottom surface and the second bottom surface includes irradiating plasma onto the first bottom surface and the second bottom surface.

10. The method of claim 8, wherein activating the first bottom surface and the second bottom surface includes applying ion impact to the first bottom surface and the second bottom surface.

11. The method of claim 8, wherein activating the first bottom surface and the second bottom surface includes irradiating radicals onto the first bottom surface and the second bottom surface.

12. The method of claim 7, wherein electrically connecting the first semiconductor chip to the second semiconductor chip includes forming through electrodes that penetrate the first and second semiconductor chips.

13. The method of claim 12, wherein the through electrodes that penetrate the second semiconductor chips are formed after the attaching process is performed.

14. The method of claim 12, further comprising forming first bumps and second bumps on the first bottom surface and the second bottom surface respectively, after formation of the through electrodes,
wherein the first bumps are formed to cover first ends of the through electrodes, and the second bumps are formed to cover second ends of the through electrodes.

15. The method of claim 13, after formation of the through electrodes, further comprising:
- forming a redistribution layer on one active layer of the first and second active layers, the redistribution layer being connected to the through electrodes; and
- forming bumps on the other active layer of the first and second active layers, the bumps being connected to the through electrodes.

16. The method of claim 13, further comprising:
- forming a redistribution layer on at least one active layer of the first and second active layers, the redistribution layer being connected to the through electrodes; and
- forming pads on the redistribution layer.

17. A semiconductor package comprising:
- a substrate; and
- a dual-layered structural semiconductor chip on the substrate,
- wherein the dual-layered structural semiconductor chip comprises:
  - a first semiconductor chip including a first silicon substrate having a first top surface and a first bottom silicon surface opposite to each other and a first active layer disposed on the first top surface; and
  - a second semiconductor chip including a second silicon substrate having a second top surface and a second bottom silicon surface opposite to each other and a second active layer disposed on the second top surface,
  - wherein the first bottom silicon surface of the first silicon substrate directly contacts the second bottom silicon surface, and the first top surface faces the substrate of the second silicon substrate.

18. The semiconductor package of claim 17, further comprising at least one additional dual-layered structural semiconductor chip vertically stacked on the dual-layered structural semiconductor chip opposite to the substrate.

19. The semiconductor package of claim 17, wherein the dual-layered structural semiconductor chip further comprises through electrodes that penetrate the first and second semiconductor chips.

20. The semiconductor package of claim 19, wherein the dual-layered structural semiconductor chip further comprises:
- first bumps disposed on the first active layer to cover the through electrodes; and
- second bumps disposed on the second active layer to cover the through electrodes,
- wherein the first bumps are electrically connected to the substrate.

21. The semiconductor package of claim 19, wherein the dual-layered structural semiconductor chip further comprises:
- a redistribution layer disposed on at least one active layer of the first and second active layers and connected to the through electrodes; and
- bumps disposed on the redistribution layer.

22. The semiconductor package of claim 19, wherein the dual-layered structural semiconductor chip further comprises:
- a redistribution layer disposed on at least one active layer of the first and second active layers and connected to the through electrodes; and
- pads on the redistribution layer.

23. A method of fabricating a semiconductor package, the method comprising:
- providing a first semiconductor chip including a first silicon substrate having a first top surface and a first bottom silicon surface opposite to each other and a first active layer disposed on the first top surface;
- providing a second semiconductor chip including a second silicon substrate having a second top surface and a second bottom silicon surface opposite to each other and a second active layer disposed on the second top surface;
- bonding the first semiconductor chip to the second semiconductor chip so that the first bottom silicon surface of the first silicon substrate directly contacts the second bottom silicon surface of the second silicon substrate;
- electrically connecting the first semiconductor chip to the second semiconductor chip to form a dual-layered structural semiconductor chip; and
- mounting the dual-layered structural semiconductor chip on a substrate.

24. The method of claim 23, further comprising stacking at least one additional dual-layered structural semiconductor chip on the dual-layered structural semiconductor chip.

25. The method of claim 23, wherein bonding the first semiconductor chip to the second semiconductor chip includes:
- activating the first bottom surface and the second bottom surface; and
- attaching the activated first bottom surface to the activated second bottom surface.

26. The method of claim 25, wherein activating the first bottom surface and the second bottom surface includes irradiating plasma onto the first bottom surface and the second bottom surface.

27. The method of claim 25, wherein activating the first bottom surface and the second bottom surface includes applying ion impact to the first bottom surface and the second bottom surface.

28. The method of claim 25, wherein activating the first bottom surface and the second bottom surface includes irradiating radicals onto the first bottom surface and the second bottom surface.

29. The method of claim 23, wherein electrically connecting the first semiconductor chip to the second semiconductor chip includes forming through electrodes that penetrate the first and second semiconductor chips.

30. The method of claim 29, wherein the through electrodes that penetrate the second semiconductor chips are formed after the bonding process is performed.

31. The method of claim 30, further comprising forming first bumps and second bumps on the first bottom surface and the second bottom surface respectively, after formation of the through electrodes,
- wherein the first bumps are formed to cover first ends of the through electrodes, and the second bumps are formed to cover second ends of the through electrodes.

32. The method of claim 30, after formation of the through electrodes, further comprising:
- forming a redistribution layer on one active layer of the first and second active layers, the redistribution layer being connected to the through electrodes; and
- forming bumps on the other active layer of the first and second active layers, the bumps being connected to the through electrodes.

33. The method of claim 30, further comprising:
- forming a redistribution layer on at least one active layer of the first and second active layers, the redistribution layer being connected to the through electrodes; and
- forming pads on the redistribution layer.

34. A system in package comprising: a substrate; a first chip on the substrate; and a second chip having a dual-layered structure disposed on the first chip opposite to the substrate, wherein the second chip comprises: a first semiconductor chip including a first silicon substrate having a first top surface and a first bottom silicon surface opposite to each other and a first active layer disposed on the first top surface; and a second semiconductor chip including a second silicon substrate having a second top surface and a second bottom silicon surface opposite to each other and a second active layer disposed on the second top surface, wherein the first bottom surface directly contacts the second bottom surface, and where the first chip and the second chip are disposed in a different region of a substrate, and where the first and second chips are configured to be electrically connected to the substrate.

35. A system in package comprising: a first chip; and a second chip having a dual-layered structure, wherein the second chip comprises: a first semiconductor chip including a first substrate having a first bottom surface; and a second semiconductor chip including a second substrate having a second bottom surface, wherein the first bottom surface directly contacts the second bottom surface, and where the first chip and the second chip are disposed in a different region of a substrate, and where the first and second chips are configured to be electrically connected to the substrate, and where the first chip and the second chip are disposed in a different region of a substrate, and where the first and second chips are configured to be electrically connected to the substrate.

36. An embedded package comprising: a dual-layered structural semiconductor chip comprising: a first semiconductor chip including a first substrate having a first bottom surface; and a second semiconductor chip including a second substrate having a second bottom surface, wherein the first bottom surface directly contacts the second bottom surface, and where the first chip and the second chip are disposed in a different region of a substrate, and where the first and second chips are configured to be electrically connected to the substrate.

* * * * *